United States Patent
Toyota et al.

(10) Patent No.: US 10,037,868 B2
(45) Date of Patent: Jul. 31, 2018

(54) PLASMA PROCESSING APPARATUS

(71) Applicant: Hitachi High-Technologies Corporation, Minato-ku, Tokyo (JP)

(72) Inventors: Koji Toyota, Tokyo (JP); Koichi Yamamoto, Tokyo (JP); Naoki Yasui, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 421 days.

(21) Appl. No.: 14/626,958

(22) Filed: Feb. 20, 2015

(65) Prior Publication Data
US 2015/0279624 A1 Oct. 1, 2015

(30) Foreign Application Priority Data
Mar. 25, 2014 (JP) .................... 2014-061124

(51) Int. Cl.
*C23C 16/00* (2006.01)
*C23F 1/00* (2006.01)
(Continued)

(52) U.S. Cl.
CPC .. *H01J 37/32146* (2013.01); *H01J 37/32192* (2013.01); *H01J 37/32935* (2013.01)

(58) Field of Classification Search
USPC ............ 156/345.24–345.28; 118/715–733
See application file for complete search history.

(56) References Cited

U.S. PATENT DOCUMENTS

2002/0029851 A1* 3/2002 Edamura ........... H01J 37/32935
156/345.12
2009/0053836 A1* 2/2009 Pipitone ................. C23C 14/54
438/10
(Continued)

FOREIGN PATENT DOCUMENTS

| JP | 2002-093781 A | 3/2002 |
| JP | 2014-022482 A | 2/2014 |
| TW | 201118943 A1 | 6/2011 |

OTHER PUBLICATIONS

Office Action dated Jul. 20, 2016 for Taiwan Patent Application No. 104105046.
(Continued)

*Primary Examiner* — Rakesh K Dhingra
(74) *Attorney, Agent, or Firm* — Miles & Stockbridge P.C.

(57) ABSTRACT

The plasma processing apparatus includes: a processing chamber disposed inside a vacuum vessel; a first high-frequency power supply outputting a first high-frequency power for supplying an electric field to generate a plasma for use in processing a sample to be processed inside the processing chamber; a sample stage disposed inside the processing chamber with the sample placed on an upper surface thereof; a second high-frequency power supply intermittently outputting a second high-frequency power for generating a bias potential to an electrode disposed inside the sample stage and capable of variably adjusting the output time; and a function to adjust operation of the plasma processing apparatus using a result of detection of a temporal change in waveform of current or voltage in a transient state of the second high-frequency power in synchronism with start of the intermittent output of the second high-frequency power.

11 Claims, 11 Drawing Sheets

(51) Int. Cl.
*H01L 21/306* (2006.01)
*H01J 37/32* (2006.01)

(56) References Cited

U.S. PATENT DOCUMENTS

| | | | |
|---|---|---|---|
| 2009/0294061 A1* | 12/2009 | Shannon | H01J 37/32091 |
| | | | 156/345.24 |
| 2010/0248489 A1 | 9/2010 | Koguchi et al. | |
| 2014/0020831 A1 | 1/2014 | Ohgoshi et al. | |

OTHER PUBLICATIONS

Office Action dated Jul. 29, 2016 for Korean Patent Application No. 10-2015-0023508.

* cited by examiner

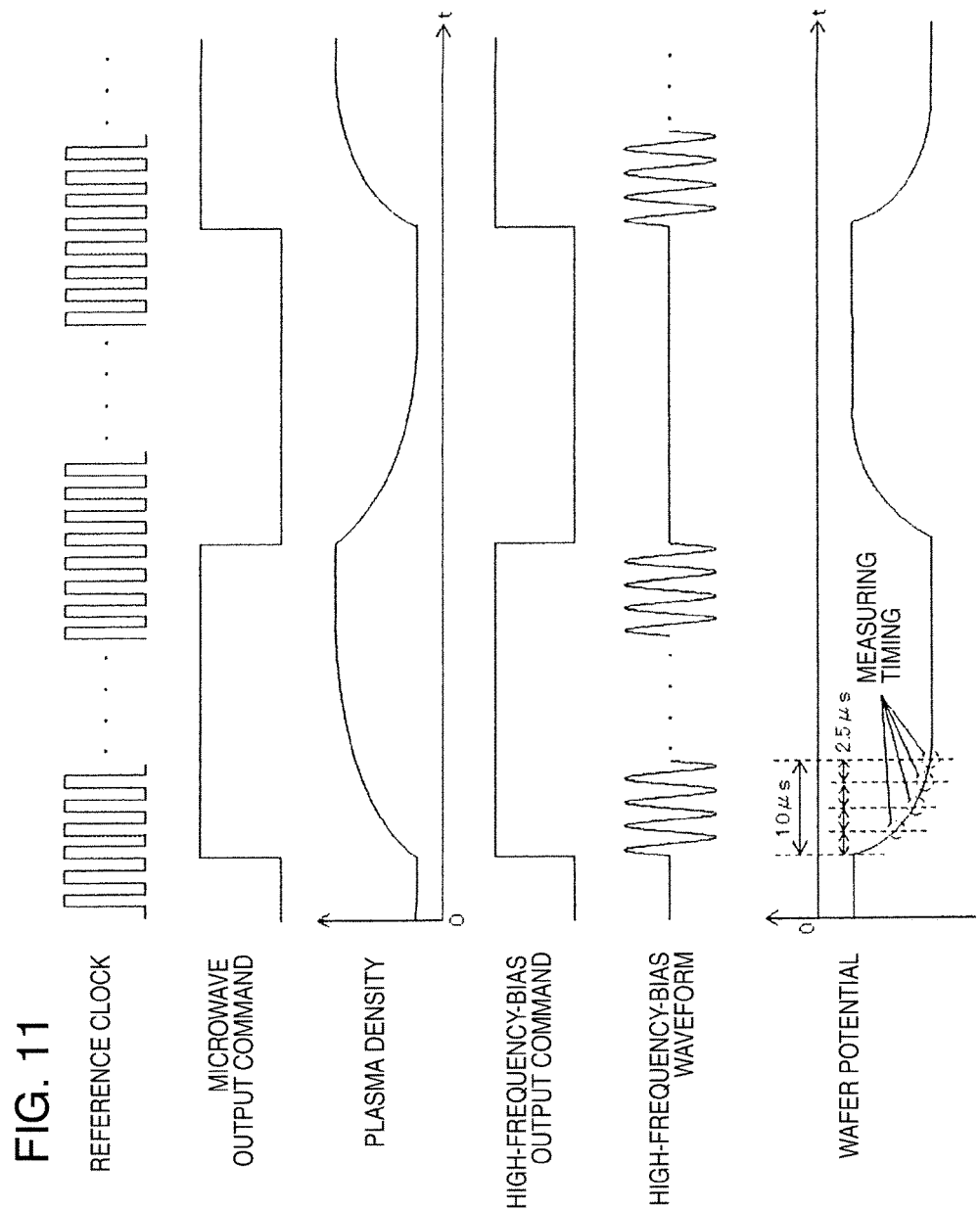

PLASMA PROCESSING APPARATUS

BACKGROUND OF THE INVENTION

The present invention relates to a plasma processing apparatus and a plasma processing method for processing a substrate-like sample such as a semiconductor wafer disposed in a processing chamber disposed inside a vacuum vessel using a plasma generated in the processing chamber, and more particularly to a plasma processing apparatus and a plasma processing method for processing a sample by forming a high-frequency-bias potential on the sample using high-frequency power supplied to an electrode disposed inside a sample stage on which the sample is placed.

As one of the processes of fabricating semiconductor devices in prior art techniques, there has been used a technique for forming a circuit wiring structure using a plasma for etching a plurality of film layers including masks disposed on a surface of a substrate-like sample such as a semiconductor wafer. Examples of such prior art techniques using plasma include a plasma processing apparatus that generates plasma by an electron cyclotron resonance (hereinafter abbreviated as ECR).

The plasma processing apparatus for etching using plasma by the ECR introduces electric and magnetic fields for generating a plasma in a processing chamber disposed inside a vacuum vessel to excite the atoms or molecules of a process gas supplied into the processing chamber thereby to generate the plasma. Inside such an apparatus, electrons introduced into the processing chamber and moving in an electric field of a high frequency such as microwave and a VHF/UHF band are subject to cyclotron motion in a magnetic field also introduced thereinto. Thus, a plasma can be efficiently generated by selecting the magnetic field strength and the high-frequency electric field frequency so as to induce resonance in both electric and magnetic fields.

Further, in order to promote etching and achieve the processed shape with a desired high accuracy, it is common practice to supply high-frequency power to a metal electrode disposed inside a sample stage which is disposed in the processing chamber and on which the sample is placed so as to introduce charged particles in the generated plasma into a film layer for processing the sample to form a desired bias potential above the sample stage or an upper surface of the sample. The high-frequency power applied to the sample is hereinafter referred to as a high-frequency-bias power or simply referred to as a high-frequency bias.

The process gas to be introduced into the processing chamber and to be used for generating plasma is selected from the gasses that can efficiently process the film layer according to the material of the film layer to be processed, and generally a halogen gas such as chlorine and fluorine is widely used as such. The etching proceeds while charged particles such as particles or ions having high activity including radicals generated by the plasma react with the material of the film layer to be processed.

In such prior art, it has been common practice to appropriately control the supply of the high-frequency bias to achieve higher precision of the shape to be etched. For example, there has been known a technique of applying a modulated or intermittent high-frequency bias to an electrode disposed inside the sample stage. Further, there have been known a technique of modulating and supplying not only the high-frequency bias but also an electric field for generating plasma or power for generating plasma; and a technique of synchronizing the time of generation between the modulated and supplied plasma generation power (electric field) and the modulated and supplied high-frequency bias.

Further, a technique is disclosed in JP-A-2002-93781 in which supply of power for generating plasma or supply of high-frequency-bias power are intermittently repeated thereby to detect temporal changes indicated by characteristic values such as plasma density and strength in the transient state, and based on this, the sample processing is controlled or the plasma processing apparatus is diagnosed.

SUMMARY OF THE INVENTION

The above prior art has encountered problems due to insufficient consideration for the following points.

Specifically, in the plasma processing field, a processed shape with higher precision of dimensions has been needed recently. In order to satisfy this need, the characteristics such as plasma density, strength, and potential need to be detected with higher precision and based on this, the apparatus operation, plasma generation, and other processing conditions need to be adjusted. Particularly, when a time-modulated intermittent high-frequency bias is applied during sample processing, the characteristics such as the generated plasma potential fluctuate in response to the high-frequency bias intermittently repeatedly turned ON and OFF. Thus, before and after the start and stop of the power supply, a transient state for transiting from one steady state to the other state is likely to appear.

Thus, in order to improve the processing precision, it is necessary to accurately know not only the transient state but also the plasma state or the state of the high-frequency bias generated on the sample. Then, in order to detect the transient state of such plasma and high-frequency bias, it is effective to detect the current voltage waveform (bias waveform) of the high-frequency bias in the transient state.

However, if the period that the plasma is in the transient state is short, it is not enough to simply measure the waveform for the short time. Assuming that the plasma transient fluctuation is on a time scale equal or close to the cycle of the high-frequency bias, in order to accurately know the fluctuation, it is necessary to determine whether or not the high-frequency bias is ON (in an applied state) in a cycle equal to or shorter than the cycle of the high-frequency bias, detect the fluctuation in the ON period, and detect the fluctuation in waveform of the high-frequency bias for each cycle.

Further, in the above prior art in which the high-frequency bias is intermittently supplied, the high-frequency bias are repeatedly turned ON and OFF, and thereby the plasma also cyclically repeats the transient state and the steady state. Thus, in order to know the plasma state with higher precision, it is needed to determine the transient state and the steady state of not only the high-frequency bias but also the plasma and detect the plasma state in the transient state.

Further, in the same manner as the detection of the high-frequency bias, it is needed to detect the fluctuation of the electric field or the power waveform for each cycle. Furthermore, the method of synchronizing and time modulating both the high-frequency bias and the plasma generation power has also encountered the similar problems.

However, the above prior art does not consider the problem of detecting the fluctuation in waveform of the high-frequency bias in the transient state. Therefore, the processing precision and thus the yield have been impaired.

It is an object of the present invention to provide a plasma processing apparatus with improved processing precision and increased yield.

Accordingly, embodiments include a plasma processing apparatus comprising: a processing chamber disposed inside a vacuum vessel; a first high-frequency power supply outputting a first high-frequency power for supplying an electric field to generate a plasma for use in processing a sample to be processed inside the processing chamber; a sample stage disposed inside the processing chamber, on an upper surface of which the sample is placed; a second high-frequency power supply intermittently outputting a second high-frequency power for generating a bias potential to an electrode disposed inside the sample stage so that a waveform of the second high-frequency power is synchronized with a cyclical signal and capable of variably adjusting the output time, and a controller configured to adjust operation of the plasma processing apparatus using a result of detection of a temporal change in a waveform of current or voltage in a transient state of the second high-frequency power, the temporal change in the waveform in the transient state of the second high-frequency power being synchronized with a start of the intermittent output of the second high-frequency power and being detected by comparing, with each other, a plurality of waveforms of current or voltage which are detected in a predetermined time length in the transient state of the second high-frequency power.

Embodiments also include a plasma processing apparatus comprising: a processing chamber disposed inside a vacuum vessel; a first high-frequency power supply outputting a first high-frequency power for supplying an electric field to generate plasma for use in processing a sample to be processed inside the processing chamber; a sample stage disposed inside the processing chamber, on an upper surface of which the sample is placed; a second high-frequency power supply outputting a second high-frequency power for generating a bias potential to an electrode disposed inside the sample stage so that a waveform of the second high-frequency power is synchronized with a cyclical signal and capable of variably adjusting ON time and OFF time of the output or a ratio thereof, and a controller configured to adjust operation of the plasma processing apparatus using a result of detection of a temporal change in waveform of current or voltage in a transient state of the second high-frequency power, the temporal change in the waveform in the transient stage of the second high-frequency power being synchronized with a start of an ON period of the second high-frequency power and being detected by comparing, with each other, a plurality of waveforms of current or voltage which are detected in a predetermined time length in the transient state of the second high-frequency power.

The above configuration allows selection of a period in which the plasma is in a steady state and a period in which the plasma is in a transient state, thereby to detect the plasma state with higher precision. Based on this, the plasma processing apparatus can be operated or the plasma processing conditions can be adjusted, and the apparatus state and the plasma processing conditions can be monitored. In particular, processing yield and processing precision can be improved by detecting and using plasma characteristics such as the time until self bias occurs, a maximum value and a minimum value of plasma density, and the rise time of the plasma density from the high-frequency bias waveform in the transient state.

Other objects, features and advantages of the invention will become apparent from the following description of the embodiments of the invention taken in conjunction with the accompanying drawings.

BRIEF DESCRIPTION OF THE DRAWINGS

FIG. 11 is a graph schematically illustrating timings of measuring the high-frequency bias according to the modification illustrated in FIG. 4.

DETAILED DESCRIPTION OF THE EMBODIMENTS

Figure 1:
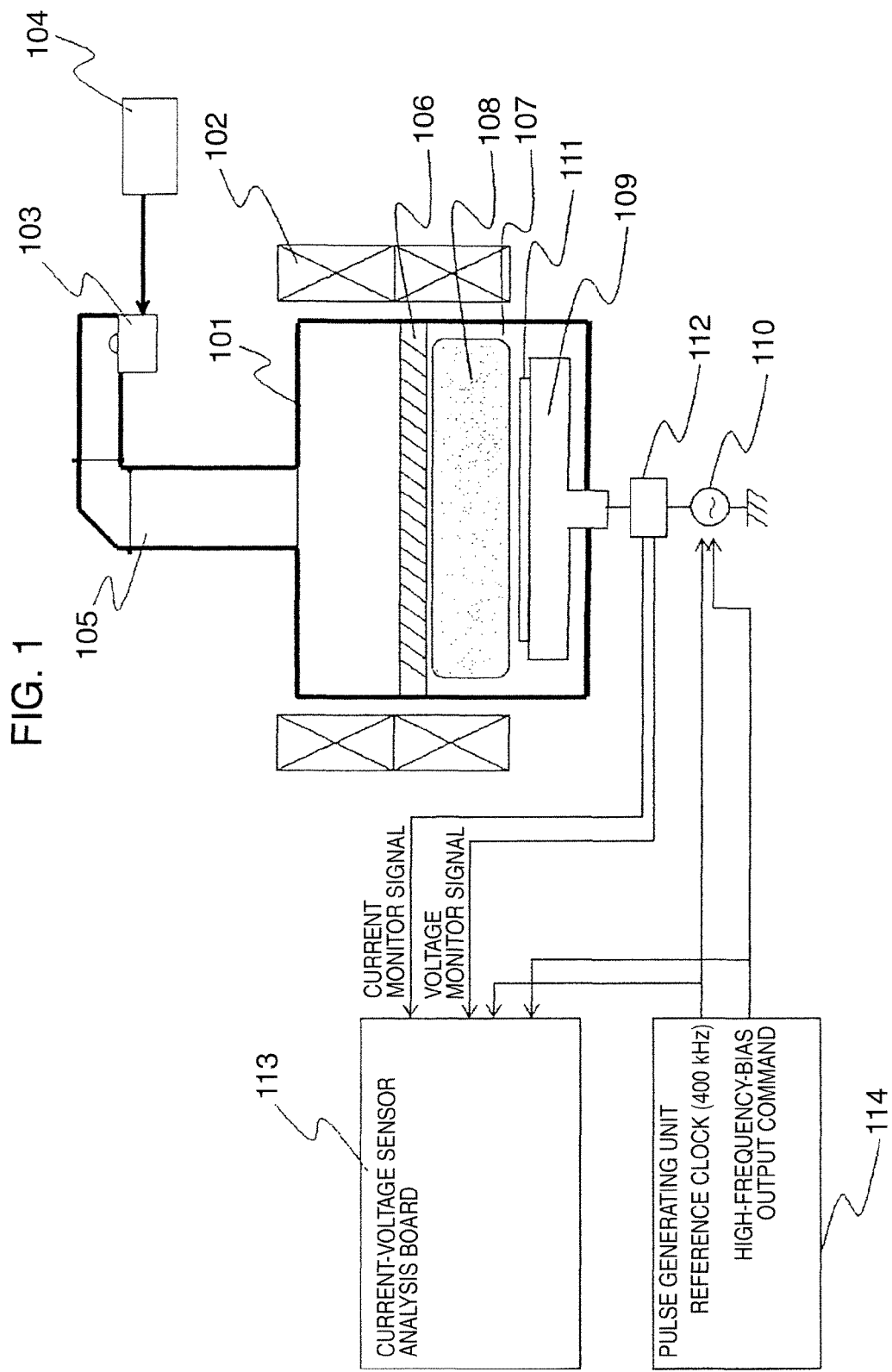
FIG. 1 is a longitudinal sectional view schematically illustrating an outline of the structure of a plasma processing apparatus according to an embodiment of the present invention.

Hereinafter, an embodiment for carrying out the present invention will be described with reference to the accompanying drawings.

First Embodiment

The first embodiment of the present invention will be described with reference to FIGS. 1 to 3, and 9 FIG. 1 is a longitudinal sectional view schematically illustrating an outline of a structure of a plasma processing apparatus according to the embodiment of the present invention.

The plasma processing apparatus according to the present embodiment introduces electric and magnetic fields for generating a plasma in a processing chamber disposed inside a vacuum vessel to excite the atoms or molecules of a process gas supplied into the processing chamber thereby to generate the plasma. According to such present embodiment, electrons moving in the electric field of a high frequency such as microwave and a VHF/UHF band introduced into the processing chamber are subject to cyclotron motion in a magnetic field also introduced therein. Thus, the plasma can be efficiently generated by selecting the magnetic field strength and the high-frequency electric field frequency so as to resonate (electron cyclotron resonance: ECR).

There is provided a reaction vessel 101 which constitutes part of the vacuum vessel with an upper portion thereof having a cylindrical shape, and includes a cylindrical processing chamber 107 therein. The processing chamber 107 has a space for generating a plasma in a depressurized interior thereof. Below the processing chamber 107, there is provided a wafer stage 109, on an upper surface of which a substrate-like sample such as a semiconductor wafer 111 to be processed is placed, and which serves as a sample stage holding the sample. In addition, below the reaction vessel 101, there is provided an exhaust device including a vacuum pump (unillustrated) such as a turbo molecular pump. The exhaust device communicates with the processing chamber 107 through an opening for exhaust disposed below the wafer stage 109 to exhaust the inside thereof and reduce the pressure therein, and is coupled to a lower surface of the reaction vessel 101.

Further, above the reaction vessel 101, there is provided a magnetron 103 generating an electric field to be supplied to the processing chamber 107; a waveguide 105 serving as a portion for propagating the electric field; and an electromagnetic wave forming unit disposed between a lower end portion of the waveguide 105 and the processing chamber 107 and including a resonance unit in which the electric field introduced from the waveguide 105 induces resonance therein and which has a diameter larger than that of the waveguide 105, and a solenoid coil 102 which generates a magnetic field and supplies the magnetic field to the processing chamber 107. Note that the portion serving as a vacuum vessel of the reaction vessel 101 is partitioned by a dielectric window 106 which is disposed above the processing chamber 107 and below the resonance unit. The dielectric window 106 is made of a dielectric member such as quartz for partitioning them and has a disc shape. The present embodiment is configured such that the interior of the processing chamber 107 under the dielectric window 106 is partitioned airtight from the exterior above the dielectric window 106. For convenience of description, the portion including the resonance unit having roughly the same diameter as that of the cylindrical portion of the processing chamber 107 is called the reaction vessel 101.

The solenoid coil 102 is disposed above and around the outer side of the reaction vessel 101 so as to surround the processing chamber 107. When DC current is supplied to the solenoid coil 102, the solenoid coil 102 generates a magnetic field, which is then supplied into the processing chamber 107. When high voltage is supplied from the microwave power supply 104 electrically connected to the magnetron 103, the magnetron 103 oscillates and generates a microwave. Then, the generated microwave electric field is propagated into the resonance unit through the waveguide 105. Then, the electric field of a particular resonant mode is transmitted through the dielectric window 106 constituting the bottom surface of the resonance unit and is introduced from above into the processing chamber 107.

The wafer stage 109 is disposed below a cylindrical space for generating plasma in the processing chamber 107. The wafer stage 109 includes a mounting surface with an upper surface thereof having a circular shape approximately the same as or close to that of the semiconductor wafer 111. The mounting surface is made of a dielectric film. In a state in which the semiconductor wafer 111 is mounted on the mounting surface, power is supplied to an unillustrated film-like electrode disposed inside the film from a DC power supply electrically connected thereto. Then, an electrostatic force is generated and the semiconductor wafer 111 is attached to and held on the mounting surface by the electrostatic force.

In a state in which the semiconductor wafer 111 attached to and held on the wafer stage 109, a processing gas (process gas) is supplied into the processing chamber 107, specifically, into the plasma generation space in the processing chamber 107, from an unillustrated gas source through a gas supply pipe conduit coupled to the reaction vessel 101. Then, the operation of the vacuum pump exhausts the gas and particles inside the processing chamber 107 through an unillustrated exhaust port disposed below the wafer stage 109. The pressure inside the processing chamber 107 is adjusted to a value within a desired range according to the balance between the flow rate and the speed of each of the process gas supplied into the processing chamber 107 and the gas exhausted through the exhaust port by the vacuum pump.

In a state in which the process gas is introduced into the processing chamber 107 and the inside of the processing chamber 107 is maintained to a value in the predetermined pressure range, an electric field and a magnetic field due to microwave are supplied into the processing chamber 107. These synergistic effects induce electron cyclotron resonance (ECR) to excite the process gas introduced into the processing chamber 107 thereby to generate a plasma 108.

A cylindrical or disc-shaped metal electrode is disposed inside the wafer stage 109. The electrode is electrically connected to the high-frequency-bias power supply 110 outputting power having a frequency in a predetermined range. When a high-frequency power is supplied to the electrode of the wafer stage 109 from the high-frequency-bias power supply 110 while the semiconductor wafer 111 is processed, a bias potential due to high frequency is generated on the upper surface of the wafer stage 109 or above the upper surface of the semiconductor wafer 111.

The difference (potential difference) between the potential of the high-frequency bias and the potential of the plasma 108 causes charged particle such as ions in the plasma 108 to be attracted to a film layer to be processed on the upper surface of the semiconductor wafer 111 and collide with it, thereby to promote physical or chemical action between the film layer and the charged particles or the active particles such as radicals in the plasma 108. At this time, high anisotropy of etching due to the above action is achieved by properly adjusting the energy of the charged particles incident on the semiconductor wafer 111.

A power sensor 112 detecting the current or voltage of the high-frequency bias applied from the high-frequency-bias power supply 110 is disposed on a power supply path such as a coaxial cable electrically connected between the high-frequency-bias power supply 110 and the wafer stage 109 (internal electrode). According to the present embodiment, a current monitor signal and a voltage monitor signal output from the power sensor 112 are transmitted to the power analysis board 113 electrically connected to the power sensor 112 through a communication means.

Further, according to the present embodiment, a pulse generating unit 114 is electrically connected to the power analysis board 113 and the high-frequency-bias power supply 110. The pulse generating unit 114 outputs a reference clock serving as a clock signal for outputting the high-frequency power to the high-frequency-bias power supply 110 as well as a high-frequency-bias output-command signal, and modulates the outputs.

The pulse generating unit 114 calculates the ON signal and the OFF signal of the high-frequency-bias output-command signal based on information about the length and the ratio of each time period of the ON and OFF input and specified by a user from outside the pulse generating unit 114 and transmits the signals to the high-frequency-bias power supply 110 as described later. Further, the reference clock and the high-frequency-bias output-command signal are also transmitted from the pulse generating unit 114 to the power analysis board 113 through a communication means, thereby allowing the current and voltage to be measured in synchronism with the ON/OFF period of the output signal of the high-frequency bias adjusted (modulated) according to the specification about each ON/OFF period and ratio (duty ratio) as described later.

Figure 2:
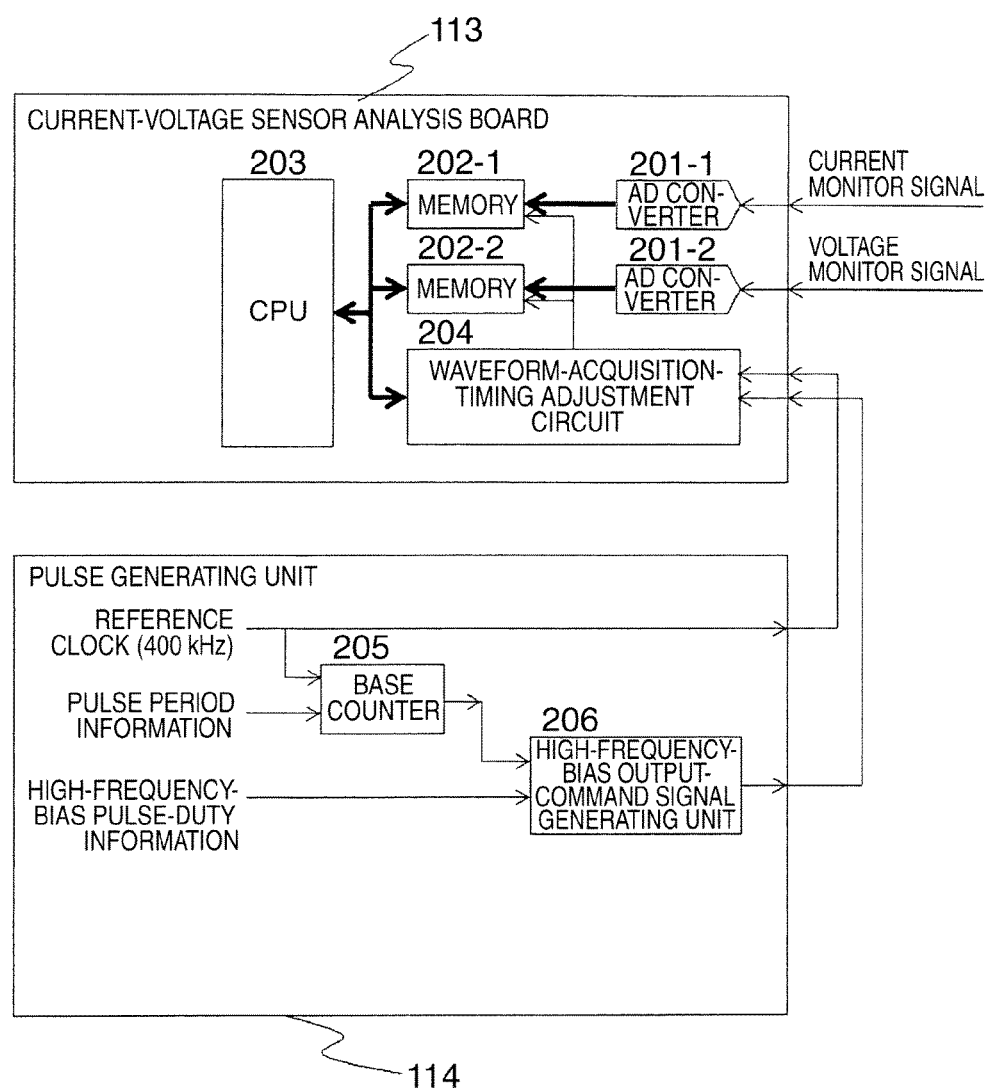
FIG. 2 is a block diagram schematically illustrating an outline of the structure of a power analysis board and a pulse generating unit according to the embodiment illustrated in FIG. 1.

FIG. 2 is a block diagram schematically illustrating an outline of a structure of the power analysis board 113 and the pulse generating unit 114 according to the embodiment illustrated in FIG. 1. The power analysis board 113 and the pulse generating unit 114 according to the present embodiment are not limited to the elements described below, but include any requirements needed to achieve other functions not described herein.

According to the present embodiment, the current monitor signal and the voltage monitor signal output from the power sensor 112 are transmitted to the power analysis board 113 through a communication means regardless of wired or wireless connection. AD converters 201-1 and 201-2 disposed on the power analysis board 113 receive the current monitor signal and the voltage monitor signal respectively and covert the signals into respective digital signals.

The converted signal values are transmitted to the respective memories 202-1 and 202-2 and stored inside thereof. Further, the CPU 203 reads the values stored in the memories 202-1 and 202-2 and uses the results to calculate the parameter values indicating the high-frequency power characteristics such as the current and voltage peaks, the effective values, the amount of distortion from an ideal sine wave, and the phase difference between the current and the voltage. The above values are stored in the memories 202-1 and 202-2 in response to a waveform-acquisition-timing signal calculated and output by a waveform-acquisition-timing adjustment circuit 204.

In response to a reference clock (or a reference clock signal) output from the pulse generating unit 114 and a high-frequency-bias output-command signal, the waveform acquisition timing is calculated by the waveform-acquisition-timing adjustment circuit 204 and is output as a signal. The reference clock generated by and transmitted from the pulse generating unit 114 is a clock signal transmitted in response to the high-frequency-bias output-command signal and further at a predetermined cycle serving as the waveform acquisition timing. The present embodiment assumes that the reference clock is transmitted every 400 kHz.

The pulse generating unit 114 includes, on the board, an oscillator originating a cyclical pulse signal serving as the reference clock; a base counter 205 generating a waveform at a predetermined cycle; and a high-frequency-bias output signal generating unit 206 generating a high-frequency-bias output signal. The pulse generating unit 114 generates a high-frequency-bias output-command signal based on the reference clock, and pulse-cycle information and high-frequency-bias pulse-duty information supplied from outside.

The base counter 205 generates and outputs a cyclical pulse waveform (a binary square wave having an ON state with a predetermined magnitude and an OFF state with a magnitude of zero in the present embodiment) corresponding to the pulse-cycle information from the reference clock signal obtained from the oscillator and the pulse-cycle information contained in data obtained from outside the connected unit through communication means. The output indicating the waveform is input to the high-frequency-bias output-command-signal generating unit 206. The high-frequency-bias output-command-signal generating unit 206 generates and outputs a high-frequency-bias output-command signal serving as a high-frequency-bias output time or timing as a specified cycle or duty ratio corresponding to the high-frequency-bias pulse-duty information contained in the received pulse waveform and data also obtained from outside the connected unit through communication means. The present embodiment assumes that the high-frequency-bias output-command signal is a square signal indicating ON and OFF states.

The present embodiment may be configured such that the AD converter 201, the memories 202, the CPU 203, and the waveform-acquisition-timing adjustment circuit 204, as well as the base counter 205, the high-frequency-bias output-command generating unit 206, or the oscillator, each may be made of a single device or a plurality of devices connected through communication means, or may be a circuit contained in a single device. Likewise, the power analysis board 113 and the pulse generating unit 114, each may be made of a single device or a plurality of devices connected through communication means, or may be a circuit contained in a single device.

Figure 3:
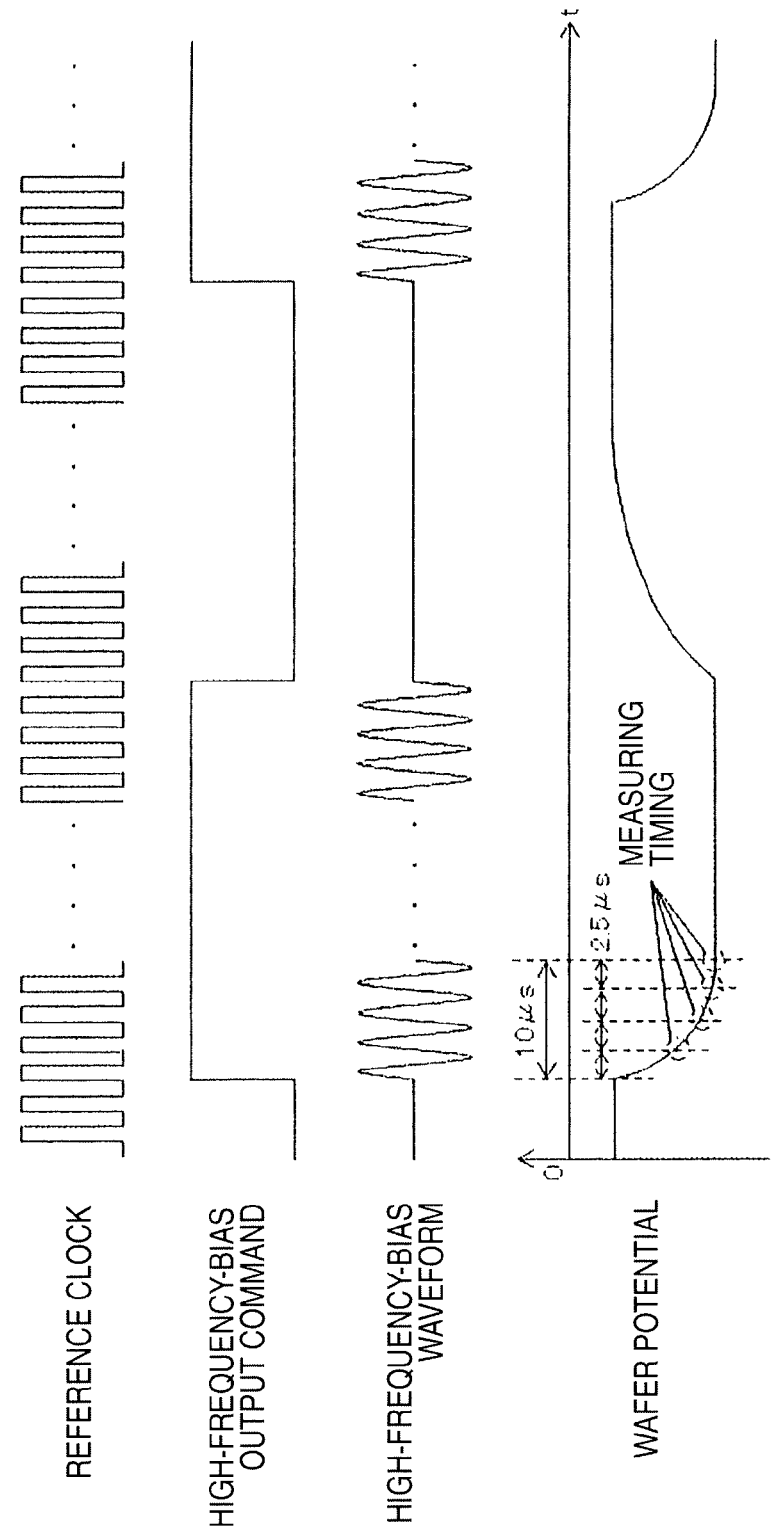
FIG. 3 is a graph schematically illustrating timings of measuring a high-frequency bias according to the embodiment illustrated in FIG. 1.

With reference to FIG. 3, the transient state of the high-frequency bias according to the present embodiment and its detection timing will be described. FIG. 3 is a graph schematically illustrating timings of measuring the high-frequency bias according to the embodiment illustrated in FIG. 1.

In the Figure, the power analysis board 113 detects the magnitude and the waveform of the high-frequency bias based on the reference clock received from the pulse generating unit 114. In such an embodiment, in response to a rise time or at a timing of any pulse of the reference clock signal turned ON and OFF in pulses, the high-frequency-bias output-command-signal generating unit 206 outputs the high-frequency-bias output-command signal as the ON signal to the high-frequency-bias power supply 110. When the signal is received, the high-frequency-bias power supply 110 outputs the high-frequency-bias power.

The high-frequency-bias power supply 110 outputs the high-frequency-bias power according to the two signals received from the pulse generating unit 114. More specifically, in response to the high-frequency-bias output-command signal which is a square signal indicating ON/OFF, when the signal is ON, the high-frequency-bias power supply 110 outputs the high-frequency bias, and when the signal is OFF, the high-frequency-bias power supply 110 stops the output. In response to the reference clock signal, the high-frequency-bias power supply 110 starts and stops outputting a waveform of the high-frequency bias for each cycle at a predetermined constant phase.

When the high-frequency-bias power is output and supplied to an electrode of the wafer stage 109, a negative voltage, also called as a self-bias voltage, is generated on the semiconductor wafer 111. By the time when such self-bias voltage enters a steady state, a time delay of about 10 μsec or less usually occurs. The present embodiment assumes that the time delay is approximately 10 μsec.

Since the frequency of the bias generating high-frequency power is 400 kHz and the cycle is 2.5 μsec, approximately four cycles of bias waveforms are present in approximately 10 μsec during which period the self bias is generated. In order to detect the current and voltage waveforms in the transient state of the high-frequency bias from the generation of such a self bias to the transition to the steady state, the present embodiment detects approximately four cycles of high-frequency-bias waveforms from a signal output as the start of the ON state indicating the start of the high-frequency-bias output command. According to the present embodiment, the power analysis board 113 detects such waveforms at a predetermined time interval as described above, but in order to improve the detection accuracy, the time interval for detecting the current or voltage values of the high-frequency power is desirably 1/10 or less of the cycle of the high-frequency bias.

Figure 9:
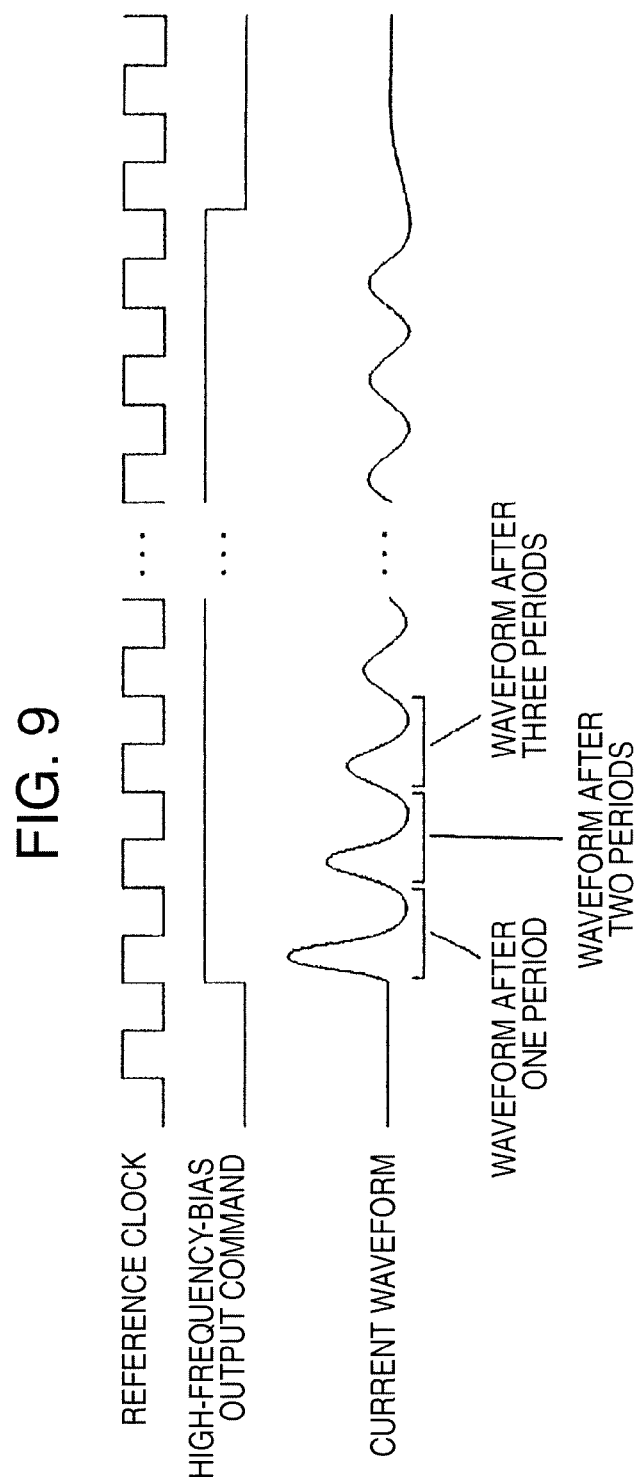
FIG. 9 is a graph schematically illustrating temporal changes in current waveforms of the high-frequency-bias power according to the embodiment illustrated in FIG. 1.

With reference to FIG. 9, a current waveform at a rise of high-frequency-bias output according to the present embodiment will be described. FIG. 9 is a graph schematically illustrating temporal changes in the current waveform of the high-frequency-bias power according to the embodiment illustrated in FIG. 1.

In general, at the start of a period in which an intermittently supplied high-frequency bias is ON, power supply starts. Then, when a self-bias voltage is generated, the semiconductor wafer 111 attracts electrons in the plasma 108 and charged, whereby the polarity thereof becomes negative. Since the electrons in the plasma 108 are attracted until such a self-bias voltage is generated, the current waveform of the high-frequency bias is such that the current on the positive side is larger than the current on the negative side as illustrated in the figure.

Subsequently, in a state in which the self-bias values are in the steady state, the current waveform of the high-frequency bias is like the current waveform on the right side as illustrated in FIG. 9, in which the positive and negative sides are symmetrical or approximately symmetrical. Thus, the comparison of waveforms at each timing in the course of generation of the self bias makes it possible to detect the time period of the transient state from the generation of the self bias to the transition to the steady state or to determine when the time period ends.

When high processing precision is required for etching, the time until the self bias or the steady state is generated may affect the processing precision. For example, if the speed from generation of the self bias to the transition to the steady state is too slow, etching progresses slowly, resulting in etching stop, which may lower the processing precision.

In this case, in synchronism with arise of the high-frequency bias, the time from the generation of a self-bias potential (voltage) to the transition to the steady state is monitored using a result of detection of the current waveform of the high-frequency bias. When the time period exceeds a predetermined acceptable range, etching is stopped assuming that the amount of deviation from a reference value of the shape after processing as a result of the processing exceeds the predetermined acceptable range, and then the stop is reported to the user of the plasma processing apparatus. According to the present embodiment, the power analysis board 113 detects such waveforms at a predetermined time interval as described above, but in order to improve the detection accuracy, the time interval for detecting the current or voltage values of the high-frequency power is desirably 1/10 or less of the cycle of the high-frequency bias.

With reference to the high-frequency-bias waveform in FIG. 9, the present embodiment calculates the root mean square of the difference of signal values for times each corresponding to each phase in each cycle between a waveform after two cycles and a waveform after three cycles from when a bias output start command (ON command) signal is output in the high-frequency-bias output command. If the time from the generation of the self bias to the transition to the steady state is within the appropriate range preset by the user, the root mean square of the difference is assumed to be a value corresponding to the appropriate range. The CPU 203 continuously detects the value of the root mean square of the difference for each time interval or for a plurality of times for each intermittent predetermined period. If the value exceeds the acceptable range, the CPU 203 stops processing.

In order to improve the SN ratio for detecting the current waveform, the present embodiment superimposes (sums) the value of the current waveform detected for each time or phase using a reference clock corresponding to the intermittently repeated ON signal of the high-frequency-bias output command or calculates the average thereof. Such a superimposition or calculation of the average requires the phase of each detected waveform to be aligned. The present embodiment superimposes and aligns the waveform at points when a specific phase of the current waveform, for example a waveform value, crosses zero, that is, when the phase becomes zero degree or 180 degrees.

According to the present embodiment, as described above, the pulse generating unit 114 internally generates and outputs the reference clock and the high-frequency-bias output-command signal to the power analysis board 133. When the power analysis board 113 receives the reference clock, the waveform-acquisition-timing adjustment circuit 204 calculates the timing. In response to the timing, the CPU 203 reads the digital value of the waveform from the memories 202-1 and 202-2. Then, the pulse generating unit 114 outputs the reference clock and the high-frequency-bias output signal to the high-frequency power supply 110 as well.

In response to the high-frequency-bias output signal, the high-frequency power supply 110 outputs the ON/OFF signal value of the high-frequency bias. In response to the received reference clock, the high-frequency power supply 110 starts to output the current or potential of the high-frequency bias for each cycle. This means that the phase at the start time when the high-frequency-bias output-command signal is ON synchronizes with the phase at the start time when the high-frequency-bias power supply 110 outputs the current or voltage of the waveform according to the command (namely, start of the first cycle) and the high-frequency bias is output in response to the reference clock from the start of the high-frequency bias for each cycle.

Therefore, each of the current waveform and the voltage waveform of the high-frequency bias is aligned at the rise of the high-frequency-bias output-command signal and at the start of the command for each cycle of the waveforms. Thus, according to the present embodiment, the start command to apply the high-frequency power for intermittently generating bias and the start command to generate the waveforms are output based on the reference clock. The phase of the high-frequency bias is equal for each cycle of the waveforms based on the reference clock. Thus, the phase of the high-frequency bias is aligned at the start of the ON signal of the high-frequency-bias output command.

This means that when the high-frequency bias is intermittently output in a predetermined same period, the current waveforms at the same time from the start of each period are synchronized with each other (the phases are aligned). The state of the plasma 108 can be detected with good precision using a result of superimposed or averaged waveforms. This result can be further used to improve the precision of adjusting the operation of the plasma processing apparatus and the processing conditions.

When the self bias is generated, the current waveform is distorted on the positive side. The current waveform can be measured and the result of detecting the degree of the distortion can be used to determine whether or not the self bias is generated.

If the self bias is not generated, the ions cannot be attracted to the wafer, and thus etching cannot be performed. Even if the self bias is generated, a small self-bias voltage has a small effect of attracting the ions to the wafer. Thus, the etching progresses slow, resulting in etching stop, which may lower the processing precision.

If that happens, the peak value on the positive side of the current waveform after the start of application of the high-frequency bias is detected. If the value is determined to be less than or equal to a predetermined value, the process is stopped, the operation of the apparatus is stopped, or the processing condition is changed. At this time, the stop or the change may be reported to the user before or after the event.

Alternatively, instead of the peak value on the positive side, the average value of the current value at the first cycle of the current immediately after the start of application of the high-frequency-bias output may be calculated. If the value is determined to be less than or equal to a predetermined value, the process may be stopped and the event may be reported in the same manner as described above. The current peak value or the average value may be periodically detected or detected for a predetermined number of times at every preset intermittent interval. If the value is determined to be less than or equal to an acceptable value, the process may be stopped.

In the above present embodiment, the operation of the plasma processing apparatus such as exhausting inside the processing chamber 107, holding the semiconductor wafer 111 on the wafer stage, supplying and stopping the microwave electric field and the high-frequency bias, generating and erasing the plasma, and adjusting the timing of detection of the current and the voltage of the plasma and the high-frequency bias, are instructed by an unillustrated control device and those operations are adjusted. The control device is communicably connected to the sensors, devices, and units constituting the plasma processing apparatus of the present embodiment, including the solenoid coil 102, the magnetron 103, the microwave power supply 104, the high-frequency-bias power supply 110, the wafer stage 109, the exhaust device such as the vacuum pump, the power sensor 112, the power analysis board 113, and the pulse generating unit 114. The control device has functions to receive data indicating the operation state of each device, calculate an operation command based on the data, and transmit the operation command to the corresponding device. The operation of the control device controls the conditions for operating the plasma processing apparatus and processing the semiconductor wafer 111, and the processing states so as to obtain a desired processing result specified by the user.

Figure 4:
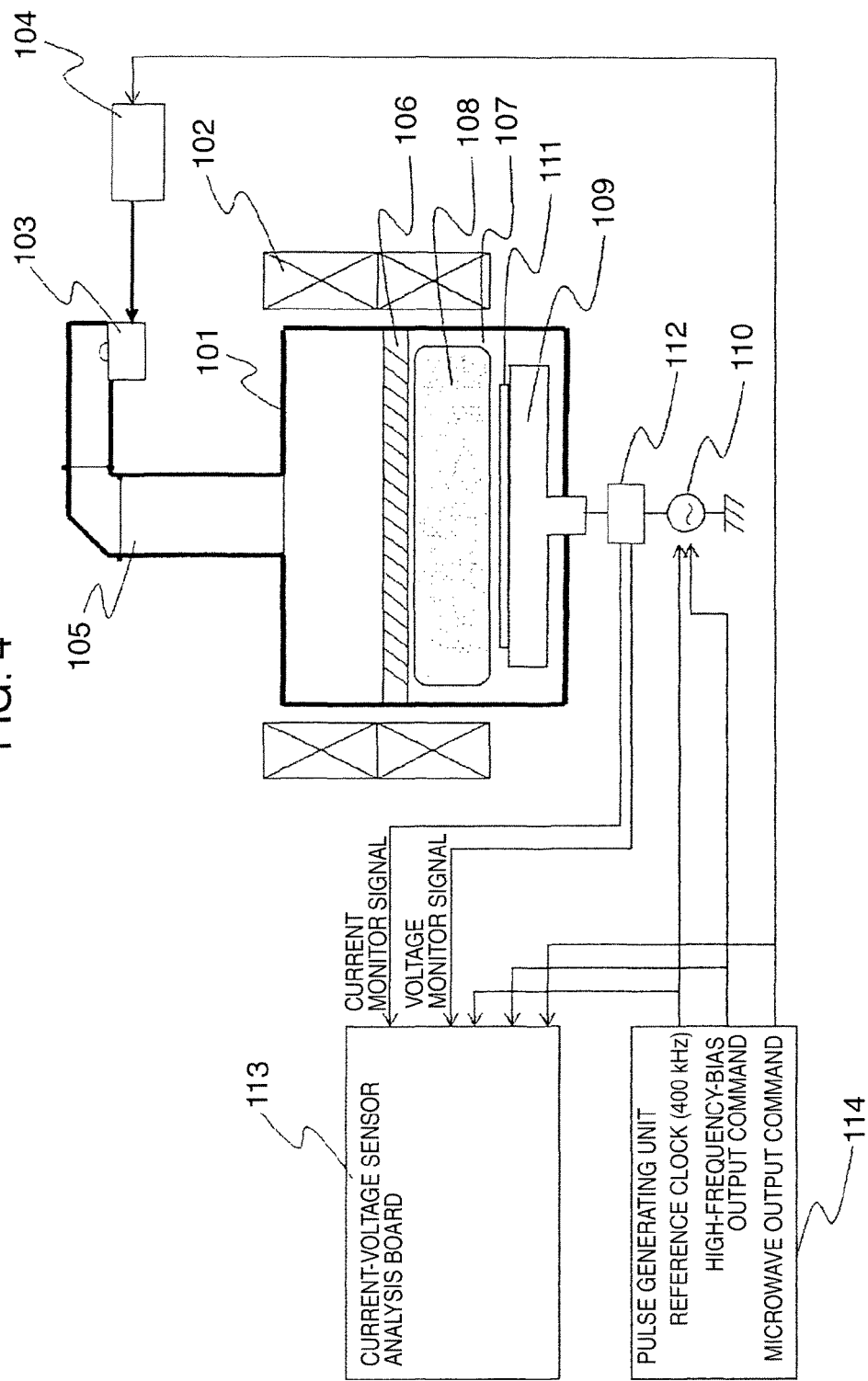
FIG. 4 is a longitudinal sectional view schematically illustrating an outline of the structure of a plasma processing apparatus according to a modification of the embodiment illustrated in FIG. 1.
Figure 5:
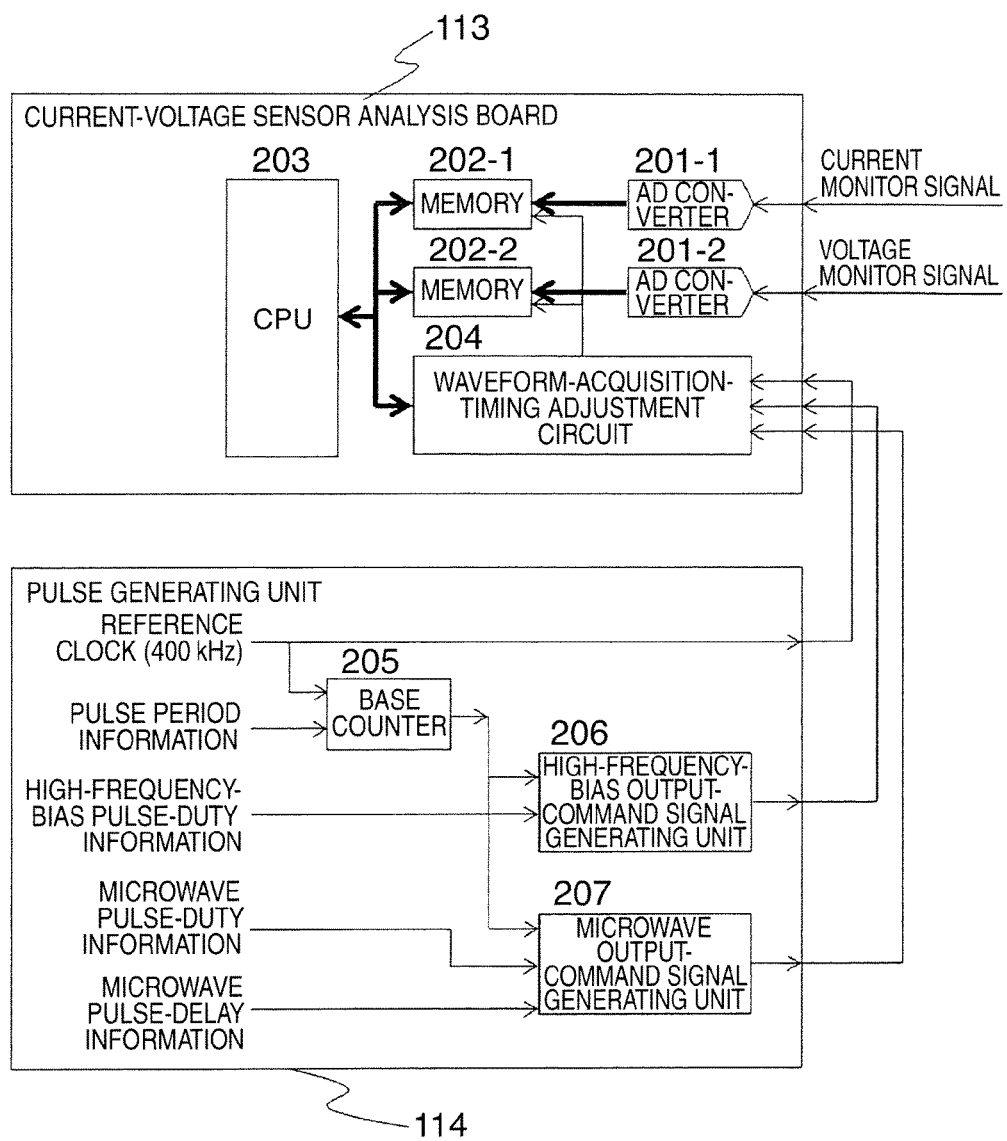
FIG. 5 is a block diagram schematically illustrating an outline of the structure of a power analysis board and a pulse generating unit according to the modification illustrated in FIG. 4.

With reference to FIGS. 4, 5, and 11, a modification of the embodiment will be described. FIG. 4 is a longitudinal sectional view schematically illustrating an outline of a structure of a plasma processing apparatus according to the modification of the embodiment illustrated in FIG. 1.

The modification in FIG. 4 is different from the embodiment in FIG. 1 in that the pulse generating unit 114 outputs a microwave output-command signal which is transmitted to the microwave power supply 104 and the power analysis board 113. The description of other components having the same configuration and action as those of the embodiment will be omitted.

According to the modification, the pulse generating unit 114 is communicably connected to the power analysis board 113, the high-frequency-bias power supply 110, and the microwave power supply 104 through communication means regardless of wired or wireless connection. The pulse generating unit 114 generates and outputs the reference clock and the high-frequency-bias output-command signal to the high-frequency-bias power supply 110 through communication means. Likewise the pulse generating unit 114 generates and outputs the microwave output-command signal to the microwave power supply 104. When the output signal is received, the microwave power supply 104 and the high-frequency-bias power supply 110 outputs a high-frequency power.

The high-frequency-bias power supply 110 modulates the high-frequency power at a timing based on the received reference clock and outputs the modulated high-frequency power according to the received command. The microwave power supply 104 modulates the microwave power in synchronism with the modulation of the high-frequency bias and outputs the modulated microwave power. Further, each output-command signal and the reference clock for each output-command signal are also transmitted to the power analysis board 113, which enables detection of the current and voltage of the high-frequency bias in synchronism with an output of the modulated high-frequency-bias power and the microwave electric field.

FIG. 5 is a block diagram schematically illustrating an outline of a structure of the power analysis board 113 and the pulse generating unit 114 according to the modification illustrated in FIG. 4. The configuration of the power analysis board 113 and the pulse generating unit 114 in FIG. 5 is different from that in FIG. 2 in that the pulse generating unit 114 includes a microwave output-command-signal generating unit 207, and the waveform-acquisition-timing adjustment circuit 204 disposed in the power analysis board 113 is configured to be able to receive a signal output from the microwave output-command-signal generating unit 207.

In the same as in the embodiment, the power sensor 112 outputs the current monitor signal and the voltage monitor signal to the power analysis board 113. Then, the current monitor signal and the voltage monitor signal are input to the AD converters 201-1 and 201-2 respectively to be converted into respective digital values. The converted values are stored in the memories 202-1 and 202-2 respectively through communication means. Further, the CPU 203 reads the values stored in the memories 202-1 and 202-2 and uses the read values to calculate the high-frequency power characteristics such as the current and voltage peaks, the effective values, the amount of distortion from an ideal sine wave, and the phase difference between the current and the voltage.

The digital values of the current or the voltage are stored in the memories 201-1 and 202-2 respectively at a timing when the waveform-acquisition-timing adjustment circuit 204 receives the reference clock (or the reference clock signal) from the pulse generating unit 114. At this time, the digital values are stored in the memories 201-1 and 202-2 at a timing when the waveform-acquisition-timing adjustment circuit 204 receives the waveform-acquisition-timing signal from the pulse generating unit 114 in the same manner as in the embodiment.

The pulse generating unit 114 generates a high-frequency-bias output-command signal and a microwave output-command signal from the pulse-cycle information, and the high-frequency-bias pulse-duty information as well as microwave pulse-duty information. The reference clock is a clock signal generated as a timing signal for outputting the high-frequency-bias output-command signal and the microwave output-command signal to the waveform-acquisition-timing adjustment circuit. According to the modification, the reference clock is 400 kHz. Note that according to the modification, the microwave output-command signal and the high-frequency-bias output-command signal are a square signal indicating ON or OFF.

The base counter 205 generates a pulse waveform having a cycle specified by the pulse-cycle information based on the reference clock and the pulse-cycle information. The generated waveform is input to the high-frequency-bias output-command-signal generating unit 206 and the microwave output-command-signal generating unit 207. The high-frequency-bias output-command-signal generating unit 206 generates and outputs a high-frequency-bias output-command signal with a specified cycle and duty ratio from the pulse waveform and the high-frequency-bias pulse-duty information. The microwave output-command-signal generating unit 207 generates and outputs a microwave output-command signal with a specified cycle and duty ratio from the pulse waveform and the microwave pulse-duty information With reference to FIG. 11, the transient state of the high-frequency bias according to the modification and the detection timing thereof will be described. FIG. 11 is a graph schematically illustrating timings of measuring the high-frequency bias according to the modification illustrated in FIG. 4.

Also in the modification, the power analysis board 113 detects the magnitude and the waveform of the high-frequency bias based on the reference clock received from the pulse generating unit 114. In response to a rise time or at a timing of any pulse of the reference clock signal turned ON and OFF in pulses, the high-frequency-bias output-command-signal generating unit 206 outputs the high-frequency-bias output-command signal as the ON signal to the high-frequency-bias power supply 110, and the microwave output-command-signal generating unit 207 outputs a microwave output-command signal. In response to the respective output-command signals, the microwave and the high-frequency bias are output respectively.

Further, in response to the high-frequency-bias output-command signal, when the signal is ON, the high-frequency-bias power supply 110 outputs the high-frequency bias, and when the signal is OFF, the high-frequency-bias power supply 110 stops the output. In response to the reference clock signal in pulses, the high-frequency-bias power supply 110 starts and stops outputting a waveform of the high-frequency bias for each cycle at a predetermined constant phase. Note that the present modification also assumes that the time of the transient state until the self-bias voltage enters the steady state is approximately 10 μsec.

Furthermore, the frequency of the high-frequency bias is 400 kHz. In order to detect the current and voltage waveforms of the high-frequency bias from when the start signal of the high-frequency-bias output command is transmitted until the generated self bias enters the steady state, the modification detects approximately four cycles of high-frequency-bias waveforms. In the present embodiment, an adjustment is made to synchronize the output of the ON signal of the high-frequency-bias output command with the output of the ON signal of the microwave output-command signal or to synchronize the timing of starting the output (ON) of the high-frequency bias with the timing of starting the output (ON) of the microwave electric field.

As shown in the Figure, the plasma density 108 due to microwave also has a so-called transient state in which the magnitude of the density varies from when the magnetron 103 starts to output the microwave electric field or the microwave power supply 104 starts to output the high-frequency power to when the value of density is made steady. The period of the transient state of the plasma 108 is usually longer than the transient state of the self bias, but the length of the transient state of the self bias and other characteristics such as the current of the high-frequency bias, the potential waveform, the peak value, and the time-averaged value may be detected in the same manner as the detection of the waveform of the high-frequency bias in the transient state of the self bias.

Figure 10:
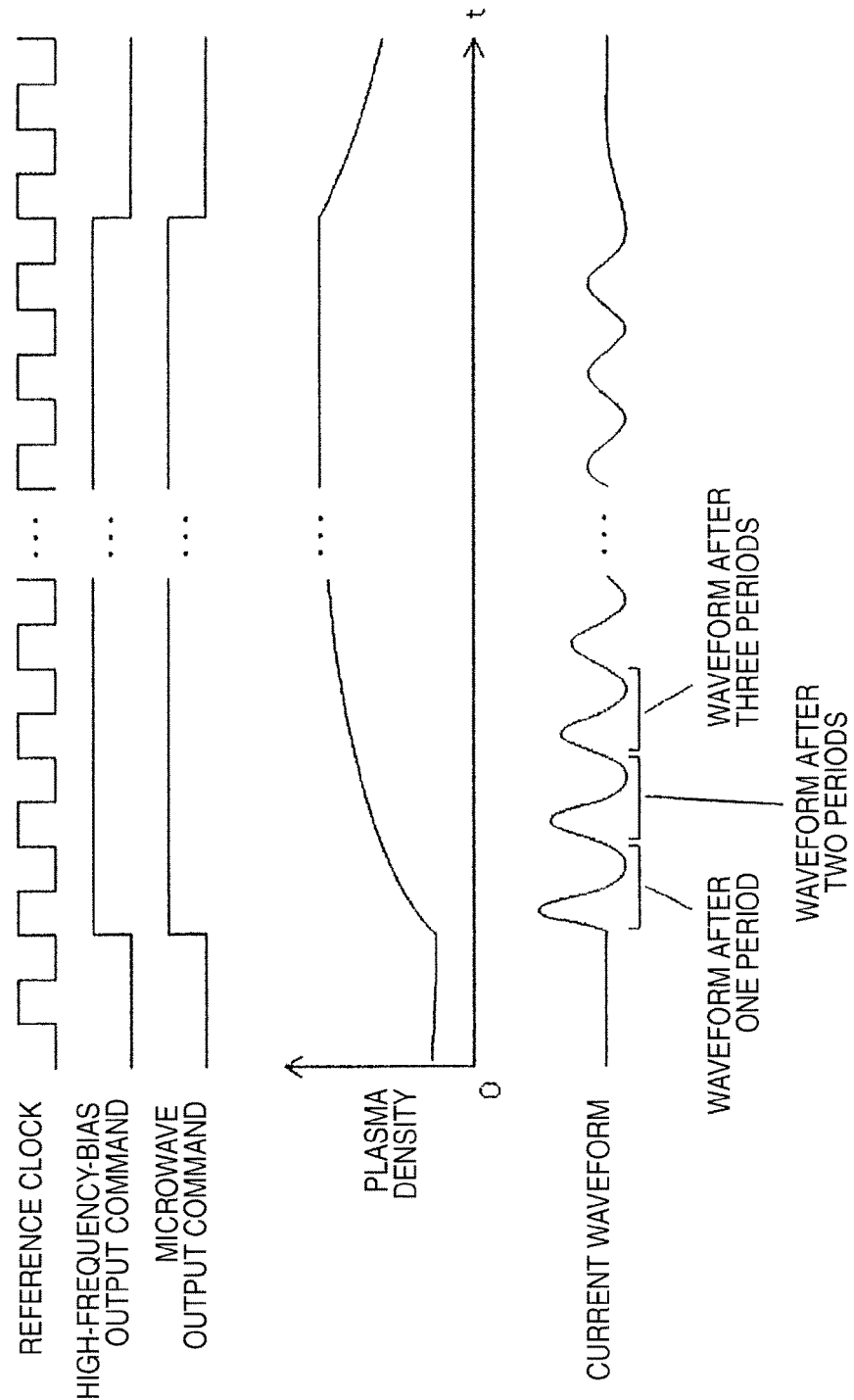
FIG. 10 is a graph schematically illustrating temporal changes in current waveforms of the plasma density and high-frequency bias according to the modification illustrated in FIG. 4.

With reference to FIG. 10, an example of the current waveform at arise of the high-frequency-bias output according to the modification will be described. FIG. 10 is a graph schematically illustrating temporal changes in the plasma density and the waveform of the high-frequency-bias current according to the modification illustrated in FIG. 4.

As described above, in a period from when the self bias is generated until the self bias transits to the steady state, the electrons in the plasma 108 are attracted, and thus the current on the positive side is larger than the current on the negative side, and the current waveform of the high-frequency bias is distorted on the positive side. Therefore, the high-frequency-bias waveform is detected at each timing in the middle of the period until the self bias enters the steady state, and the detected high-frequency-bias waveform is compared with a reference value, whereby the time of the transient state of the self bias can be detected or the time of the end of the transient state can be determined.

In particular, the present invention is configured such that the power for generating the high-frequency bias is synchronized with the power for generating the plasma 108, and the output timing and the output time are variably adjusted (modulated) in an outputable manner. In such a configuration, the plasma 108 is generated by synchronizing the application of the high-frequency bias with the application of the high-frequency power for generating the plasma 108. Therefore, in comparison with the modulation of only the high-frequency bias, the transient fluctuation of the self-bias voltage and the transient fluctuation of the high-frequency-bias current waveform are considered to be increased. This means a greater significance for detecting the waveform fluctuation of the current or the voltage in the transient state of the high-frequency bias.

When high processing precision is required for etching, the time until the self bias is generated may affect the processing precision. For example, if the speed of generating the self bias is too slow, etching progresses slowly, resulting in etching stop, which may lower the processing precision.

In this case, in synchronism with arise of the high-frequency bias, the current waveform of the high-frequency bias is detected and the time when the self-bias voltage is generated is detected. If the time is determined to deviate from a predetermined range, etching may be stopped or the processing condition may be changed, and the event may be reported. For example, in FIG. 10, the temporal changes of the current waveform of the high-frequency bias in the transient state are detected, and more particularly the root mean square of the difference between the waveform after two cycles and the waveform after three cycles is calculated.

If the time from the generation of the self bias to the transition to the steady state is a value within an appropriate range preset by the user, the root mean square of the difference is determined to be less than or equal to the upper limit value corresponding to the appropriate range. The CPU 203 continuously detects the value of the root mean square of the difference for each time interval or for a plurality of times for each intermittent predetermined period. If the value exceeds the acceptable range, the CPU 203 stops processing.

In order to improve the SN ratio for detecting the current waveform, the present modification superimposes the current waveforms detected based on a reference clock corresponding to the intermittently repeated ON signal of the high-frequency-bias output command or calculates the average thereof. Such a superimposition or calculation of the average requires the phase of each detected waveform to be aligned. The present modification superimposes and aligns the waveform at points when a specific phase of the current waveform, for example a waveform value, crosses zero, that is, when the phase becomes zero degree or 180 degrees.

Like the embodiment, the modification is also configured such that the pulse generating unit 114 transmits the reference clock to the high-frequency-bias power supply 110 and the waveform-acquisition-timing adjustment circuit 204 on the power analysis board 113. Each of the current waveform and the voltage waveform of the high-frequency bias is aligned at the rise of the high-frequency-bias output-command signal and at the start of the command for each cycle of the waveforms. When the high-frequency bias is intermittently output in the same period, the current waveforms at the same time from the start of each period are synchronized with each other (the phases are aligned). Thus, the state of the plasma 108 can be detected with good precision using a result of superimposed or averaged waveforms. This result can be further used to improve the precision of adjusting the operation of the plasma processing apparatus and the processing conditions. In addition, the period of the transient state of the self bias and the end of the period can be detected by detecting the distortion of the current waveform of the self bias in the transient state.

Further, the peak value on the positive side of the current or the voltage after the start of each application of the intermittently applied high-frequency bias may be monitored. If the value is less than or equal to a predetermined value, the processing may be stopped. Alternatively, instead of the peak value on the positive side, the averaged value for one cycle of the current waveform immediately after the application of the high-frequency-bias output may be calculated and used. Still alternatively, the peak value on the positive side or the averaged value may be constantly or periodically monitored. If the value is less than or equal to the predetermined value, the processing may be stopped.

Figure 6:
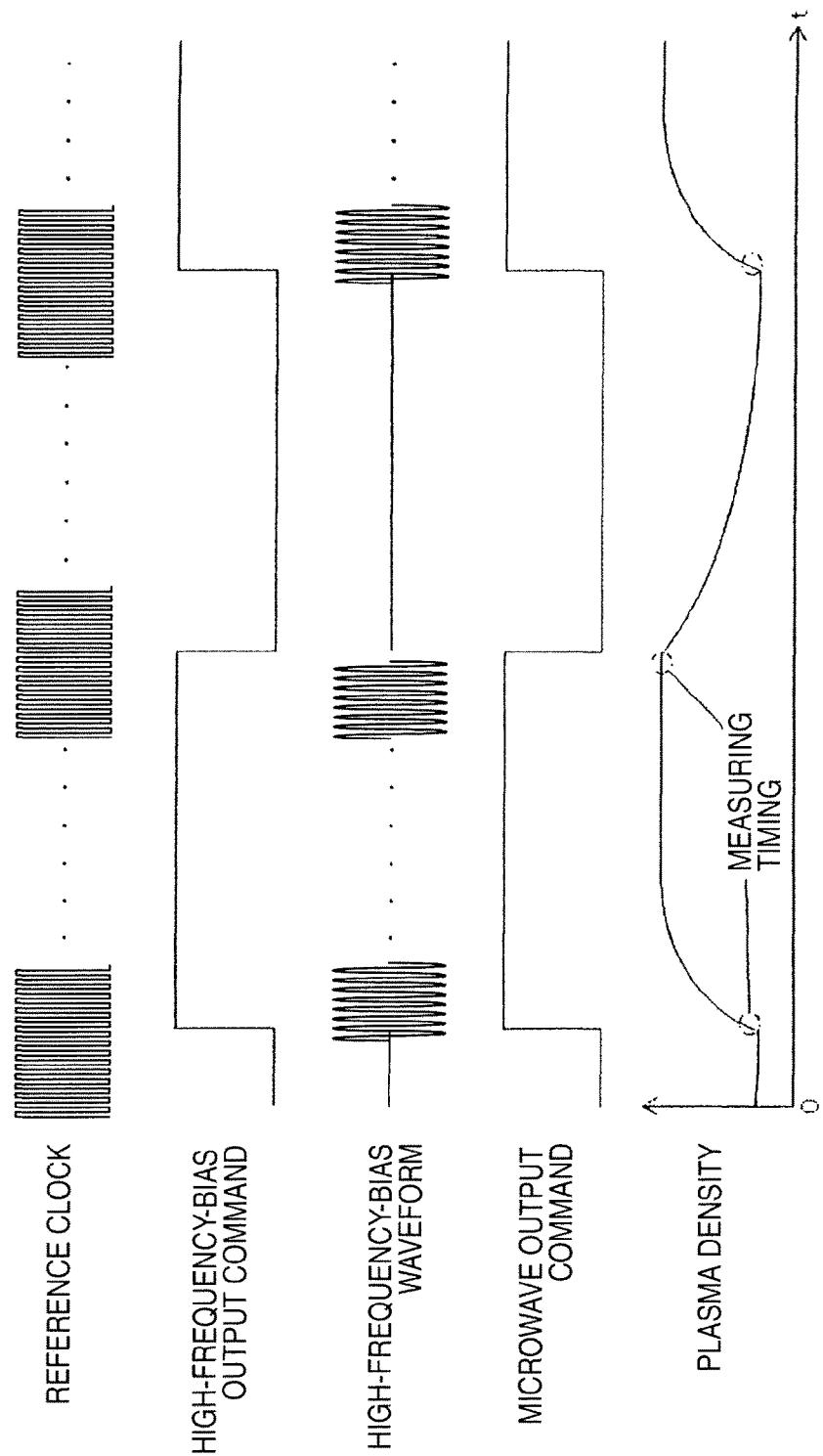
FIG. 6 is a graph schematically illustrating temporal changes in microwave, high-frequency bias, and plasma density of a plasma processing apparatus according to still another modification of the embodiment illustrated in FIG. 1.
Figure 7:
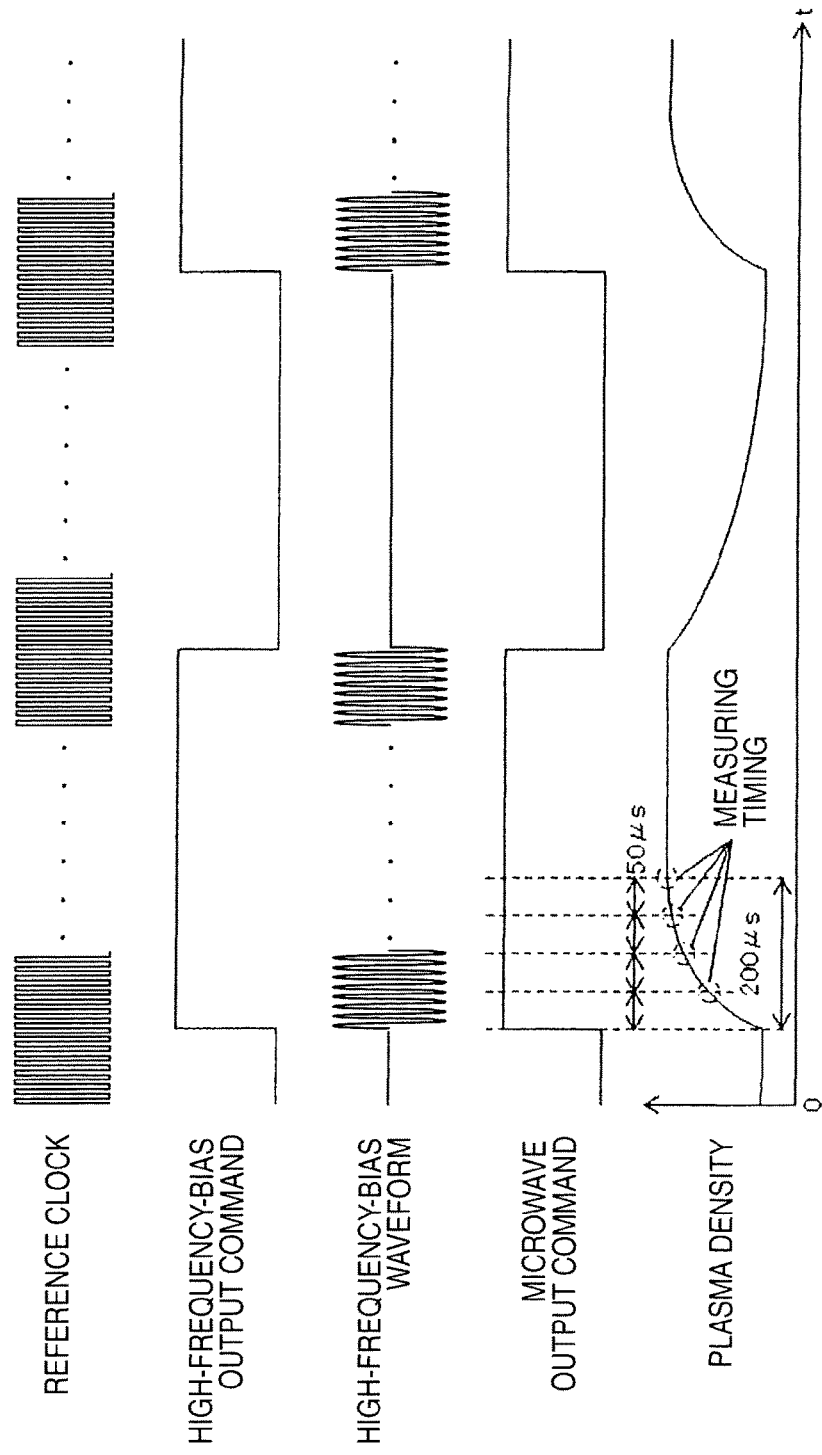
FIG. 7 is a graph schematically illustrating temporal changes in microwave, high-frequency bias, and plasma density during processing and timings of detecting the plasma density in the transient state during processing in a plasma processing apparatus according to the still another modification of the embodiment illustrated in FIG. 1.
Figure 8:
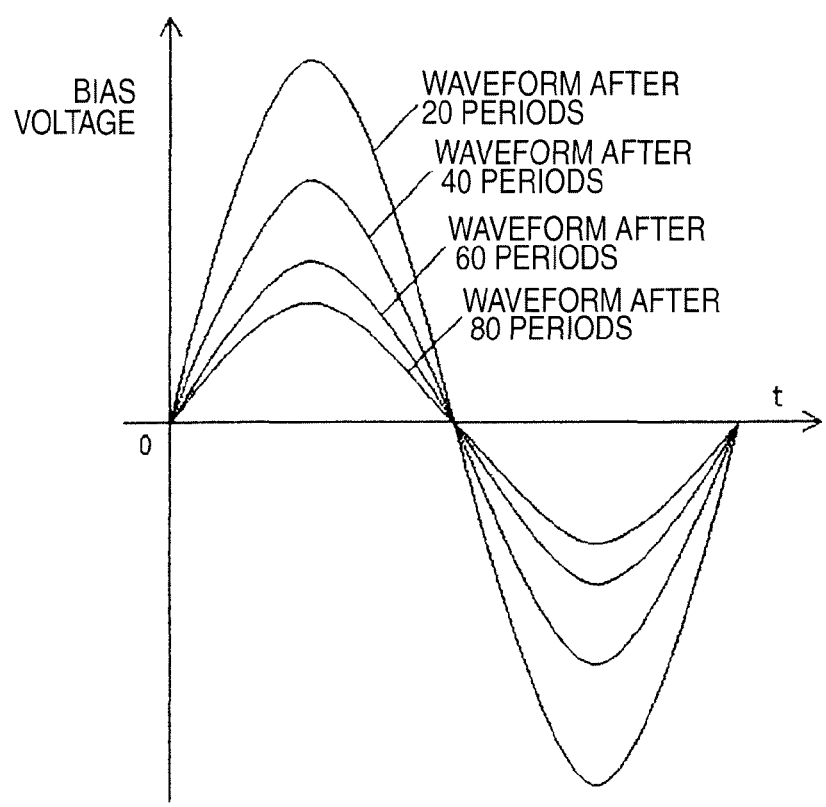
FIG. 8 is a graph schematically illustrating results of detecting waveforms of the voltage of the high-frequency bias for every 20 cycles after transmission of a high-frequency-bias output command in the plasma processing apparatus according to the still another modification of the embodiment illustrated in FIG. 1.

With reference to FIGS. 6 to 8, another (second) modification will be described. The plasma processing apparatus according to the second modification has the similar configuration to that of the modification illustrated in FIGS. 4 and 5.

FIG. 6 is a graph schematically illustrating temporal changes in microwave, high-frequency bias, and plasma density 108 of a plasma processing apparatus according to the second modification of the embodiment illustrated in FIG. 1. Also in the second modification, the pulse generating unit 114 transmits a microwave output-command signal and a high-frequency-bias output-command signal based on a reference clock signal. Based on the reference clock, the power analysis board 113 detects the waveform of current or voltage of the high-frequency bias.

More specifically, the ON signal of the microwave output command, which is a binary square wave indicating ON or OFF, is transmitted in synchronism with a rise of any pulse of the reference clock signal. When the ON signal is received, the microwave power supply 104 outputs power and then the magnetron 103 outputs the microwave electric field. In addition, in synchronism with any reference clock related to such a microwave output, the pulse generating unit 114 transmits the ON signal of a binary square wave of the high-frequency-bias output-command signal to the high-frequency power supply 110. Then, the high-frequency power supply 110 outputs power to generate a high-frequency bias on the wafer stage 109 or the semiconductor wafer 111.

When the output microwave electric field is supplied into the processing chamber 107 through the waveguide 105 and dielectric window 106, the plasma density 108 inside the processing chamber 107 starts to rise. Subsequently, while the microwave is being output (during ON state), the plasma density 108 is maintained at a predetermined relatively high value and enters the steady state. When the supply of the microwave electric field is stopped into an OFF state, the plasma density 108 is gradually reduced from the predetermined value, and returns to the value before the supply of the microwave started according to the second modification. Note that according to the second modification, even if the microwave is in the OFF state, the plasma 108 is not completely removed from the processing chamber 107.

If the plasma density 108 deviates from an allowable range of a desired value, that is, the plasma density 108 is too high or too low, the density may have an adverse effect on the precision of the shape to be etched. For example, in the case of too high plasma density 108, an increase of the density of relatively highly reactive radicals generated in the plasma 108 inside the processing chamber 107 may generate processing defects such as side etching. On the contrary, an increase of the density of radicals with a relatively high deposition property may cause etching stop, which may also cause processing defects.

Further, too low plasma density 108 may also cause processing defects opposite to that described above. In order to solve the above problems, the second modification detects a maximum value and a minimum value of the plasma density 108 using a result of the detection of the waveform of voltage or current of the high-frequency bias at a timing immediately before the microwave electric field is OFF or at a timing immediately after the microwave electric field is ON in synchronism with the pulse waveform serving as the reference clock while the semiconductor wafer 111 is being etched. If the maximum value and the minimum value deviate from a predetermined range, the second modification stops the operation of the plasma processing apparatus or the processing of the semiconductor wafer, or changes the processing conditions. Thus, the second modification can improve the yield of the semiconductor wafer 111 and further the semiconductor devices to be fabricated from the wafer. Note that immediately after the operation or processing is stopped or the processing conditions are changed, or before any of the above is performed, the event may be reported to the user.

FIG. 7 is a graph schematically illustrating temporal changes in the microwave, the high-frequency bias, and the plasma density during the processing and timings of detecting the plasma density in the transient state during the processing according to the second modification. In FIG. 7, when the magnetron 103 supplies a microwave electric field into the waveguide 105 in response to an output from the microwave power supply 104, the electric field is introduced into the processing chamber 107 as described above. Then, the plasma density 108 starts to rise, subsequently reaches a certain value within an allowable range, and then transits to a steady state maintaining the certain value.

The time of the transient state from rise of the plasma density 108 to the transition to the steady state is generally several hundreds μsec, and particularly the second modification assumes that the time is about 200 μsec. Since the high-frequency-bias power has a frequency of 400 kHz, that is, a cycle of 2.5 μsec, the waveform of current or voltage of the high-frequency bias has about 80 cycles during the period of 200 μsec of the transient state of the plasma 108.

The second modification detects a waveform of current or voltage of the high-frequency bias in the transient state at a rise of the plasma 108, not all waveforms in the 80 cycles are required to be measured, but only the waveforms in a range of an appropriate number of cycles or every specific number of cycles may be detected. For example, the waveforms may be detected every 20 cycles after the ON signal of the high-frequency-bias output-command signal is transmitted.

FIG. 8 is a graph schematically illustrating results of detecting a waveform of voltage of the high-frequency bias every 20 cycles after the transmission of the high-frequency-bias output command according to the second modification. In the figure, only one wavelength of the voltage waveform is detected every 20 cycles, and the voltage waveform is illustrated with each phase aligned and superimposed.

As illustrated in the figure, the microwave output command is transmitted in synchronism with the high-frequency-bias output command to supply the microwave electric field into the processing chamber 107, in which the plasma density 108 starts to rise, causing the impedance of the plasma 108 to reduce and the peak of the waveform of voltage of the high-frequency bias to reduce. The larger the plasma density 108, the smaller the impedance. Thus, it can be seen that in the transient state after the ON signal of the high-frequency-bias output-command signal is transmitted, the waveform of voltage of the high-frequency bias detected every 20 cycles reduces in amplitude or peak value as the number of cycles increases in multiples of 20.

Thus, at a plurality of appropriate timings in the transient state in which the plasma density 108 rises, the waveform of the high-frequency bias is detected and the detected values are compared, which can determine the period of the transient state of the plasma 108 or the end of the period. Note that FIG. 7 illustrates a waveform of voltage as an example, but a waveform of current may be used or a waveform of both voltage and current may be used.

Alternatively, if the time of the transient state obtained by detecting the waveform of current or voltage of the high-frequency bias in the transient state which is supplied in synchronism with the start of supply of the microwave electric field or the start of the transient state of the plasma 108 is determined to be deviating from a predetermined allowable range, the operation of the plasma processing apparatus or the plasma processing may be stopped or the processing condition may be changed. For example, in FIG. 8, the root mean square of the difference between the waveform after 60 cycles and the waveform after 80 cycles is calculated. Then, if the calculated value is determined to be greater than or equal to a predetermined value, the processing may be stopped.

In order to improve the SN ratio of the waveform of the high-frequency bias to be detected, this example also superimposes the waveforms at a plurality of points detected based on the pulse waveform of the reference clock or calculates the average. When calculating, in order to align the phase of the waveform, specific phases of the waveform are superimposed or the average is calculated. Also in this example, the waveform of current or voltage is detected in synchronism with the high-frequency-bias output command transmitted based on the pulse waveform of the reference clock. Thus, the phase of each waveform of the high-frequency bias is synchronized with the pulse waveform of the reference clock. The values of the waveform with the same phase every 20 cycles are superimposed or the average is calculated. Thus, values of the waveform with a high precision can be detected, so that the processing precision and the processing yield can be improved.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
a processing chamber disposed inside a vacuum vessel;
a first high-frequency power supply outputting a first high-frequency power for supplying an electric field to generate a plasma for use in processing a sample to be processed inside the processing chamber;
a sample stage disposed inside the processing chamber, on an upper surface of which the sample is placed;
a second high-frequency power supply intermittently outputting a second high-frequency power for generating a bias potential to an electrode disposed inside the sample stage so that a waveform of the second high-frequency power is synchronized with a reference cyclical signal and capable of variably adjusting the output time, and
a controller configured to adjust operation of the plasma processing apparatus using a result of detection of a temporal change in a waveform of current or voltage in a transient state of the second high-frequency power, the temporal change in the waveform in the transient state of the second high-frequency power being synchronized with a start of the intermittent output of the second high-frequency power and being detected by comparing, with each other, a plurality of waveforms of current or voltage which are detected in a predetermined time length in the transient state of the second high-frequency power.

2. The plasma processing apparatus according to claim 1, wherein
the temporal change in waveform of current or voltage in the transient state of the second high-frequency power is detected while synchronized with the reference cyclical signal.

3. The plasma processing apparatus according to claim 1, wherein
the temporal change in the waveform is detected by comparing the plurality of waveforms of current or voltage with each other, among the plurality of waveforms in a predetermined time length in the transient state of the second high-frequency power, the phases of the plurality of waveforms being aligned with each other.

4. The plasma processing apparatus according to claim 1, wherein
stop of the plasma processing apparatus or change of the processing condition is conducted using a result of detection of the temporal change in waveform of current or voltage in the transient state of the second high-frequency power.

5. The plasma processing apparatus according to claim 1, wherein
the waveform of the second high-frequency power is detected at every predetermined time interval in the transient state.

6. The plasma processing apparatus according to claim 1, wherein the controller is further configured to detect the temporal change in the waveform by determining a time from generation of a self-bias voltage to a transition to a steady state of said waveform in which positive and negative components are substantially symmetrical.

7. A plasma processing apparatus comprising:
a processing chamber disposed inside a vacuum vessel;
a first high-frequency power supply outputting a first high-frequency power for supplying an electric field to generate plasma for use in processing a sample to be processed inside the processing chamber;
a sample stage disposed inside the processing chamber, on an upper surface of which the sample is placed;
a second high-frequency power supply outputting a second high-frequency power for generating a bias potential to an electrode disposed inside the sample stage so that a waveform of the second high-frequency power is synchronized with a reference cyclical signal and capable of variably adjusting ON time and OFF time of the output or a ratio thereof, and
a controller configured to adjust operation of the plasma processing apparatus using a result of detection of a temporal change in waveform of current or voltage in a transient state of the second high-frequency power, the temporal change in the waveform in the transient stage of the second high-frequency power being synchronized with a start of an ON period of the second high-frequency power and being detected by comparing, with each other, a plurality of waveforms of current or voltage which are detected in a predetermined time length in the transient state of the second high-frequency power.

8. The plasma processing apparatus according to claim 7, wherein
the temporal change in waveform of current or voltage in the transient state of the second high-frequency power is detected while synchronized with the reference cyclical signal.

9. The plasma processing apparatus according to claim 7, wherein the temporal change in the waveform is detected by comparing the plurality of waveforms of current or voltage with each other, among the plurality of waveforms in a predetermined time length in the transient state of the second high-frequency power, the phases of the plurality of waveforms being aligned with each other.

10. The plasma processing apparatus according to claim 7, wherein stopping of the plasma processing apparatus or changing of the processing condition is conducted using a result of detection of the temporal change in waveform of current or voltage in the transient state of the second high-frequency power.

11. The plasma processing apparatus according to claim 7, wherein the controller is further configured to detect the temporal change in the waveform by determining a time from generation of a self-bias voltage to a transition to a steady state of said waveform in which positive and negative components are substantially symmetrical.

* * * * *